(12) United States Patent
Meneghetti et al.

(10) Patent No.: US 8,933,157 B2
(45) Date of Patent: Jan. 13, 2015

(54) MIXED BORON NITRIDE COMPOSITION AND METHOD FOR MAKING THEREOF

(75) Inventors: Paulo Meneghetti, Avon, OH (US); Chandrashekar Raman, Sheffield Village, OH (US)

(73) Assignee: Momentive Performance Materials Inc., Waterford, NY (US)

( * ) Notice: Subject to any disclaimer, the term of this patent is extended or adjusted under 35 U.S.C. 154(b) by 1152 days.

(21) Appl. No.: 11/973,124

(22) Filed: Oct. 5, 2007

(65) Prior Publication Data

US 2008/0153960 A1 Jun. 26, 2008

Related U.S. Application Data

(60) Provisional application No. 60/828,634, filed on Oct. 7, 2006.

(51) Int. Cl.
  *C08K 3/28* (2006.01)
  *C01B 21/064* (2006.01)
  *B82Y 30/00* (2011.01)
  *C08K 3/38* (2006.01)
  *H05K 1/03* (2006.01)

(52) U.S. Cl.
  CPC .............. *C01B 21/064* (2013.01); *B82Y 30/00* (2013.01); *C01B 21/0648* (2013.01); *C08K 3/38* (2013.01); *C01P 2002/02* (2013.01); *C01P 2002/20* (2013.01); *C01P 2004/32* (2013.01); *C01P 2004/50* (2013.01); *C01P 2004/54* (2013.01); *C01P 2004/61* (2013.01); *C01P 2004/64* (2013.01); *C01P 2006/11* (2013.01); *C01P 2006/22* (2013.01); *C08K 2201/014* (2013.01); *H05K 1/0373* (2013.01)

USPC .......... 524/404; 423/290; 501/96.4; 257/717; 428/323; 428/402

(58) Field of Classification Search
USPC .......... 524/404; 423/290; 501/96.4; 257/717; 428/323, 402
See application file for complete search history.

(56) References Cited

U.S. PATENT DOCUMENTS

| | | | | |
|---|---|---|---|---|
| 6,020,424 A | * | 2/2000 | Osuna et al. | 524/847 |
| 6,054,520 A | * | 4/2000 | Washio et al. | 524/404 |
| 6,162,849 A | * | 12/2000 | Zhuo et al. | 524/404 |
| 6,645,612 B2 | * | 11/2003 | Pujari et al. | 428/325 |
| 6,713,088 B2 | * | 3/2004 | Lodyga et al. | 424/489 |
| 6,761,842 B2 | * | 7/2004 | Tobita et al. | 264/435 |
| 6,831,031 B2 | * | 12/2004 | Ishihara | 501/96.4 |
| 2003/0073769 A1 | | 4/2003 | Pujari et al. | |
| 2003/0175499 A1 | | 9/2003 | Phillips | |
| 2006/0121068 A1 | | 6/2006 | Sane et al. | |

FOREIGN PATENT DOCUMENTS

| EP | 1 702 907 A2 | 9/2006 |
|---|---|---|
| EP | 1702907 A2 * | 9/2006 |
| JP | 11-060216 | 3/1999 |

OTHER PUBLICATIONS

International Search Report; International Application No. PCT/US2007/021419; pp. 1-4.

(Continued)

*Primary Examiner* — Satya Sastri
(74) *Attorney, Agent, or Firm* — Joseph E. Waters (57) ABSTRACT

A boron nitride composition comprising at least two different boron nitride powder materials having different properties, e.g., surface areas, particle size, tap density, etc.

16 Claims, 4 Drawing Sheets

(56) References Cited

OTHER PUBLICATIONS

Howard A. Barnes, A Handbook of Elementary Rheology, Chapter 15, The University of Wales Institute of Non-Newtonian Fluid Mechanics (2000).
Notification of Reexamination for CN 200780037329.3 dated Jun. 4, 2013.
Japanese Office Action for JP 2009-531468 dated Mar. 26, 2013.
Translation of Japanese Office Action for JP 2009-531468 dated Feb. 12, 2014.
Patent Abstracts of Japan, Heat Conductive Boron Nitride Filler and Insulating Heat Releasing Sheet, Publication No. JPH11-060216, Washio, et al., Mar. 2, 1999.

* cited by examiner

MIXED BORON NITRIDE COMPOSITION AND METHOD FOR MAKING THEREOF

CROSS-REFERENCE TO RELATED APPLICATIONS

This application claims priority to a provisional patent application No. 60/828,634, entitled "Mixed Boron Nitride Composition and Method for Making Thereof," filed on Oct. 7, 2006 by the inventors of this application.

FIELD OF THE INVENTION

The present invention relates to a boron nitride composition comprising a mix of different boron nitride powders, for use in applications including forming polymer-based compounds.

BACKGROUND OF THE INVENTION

Boron nitride ("BN") comes in a variety of crystalline structures and has a variety of uses from polishing agents to lubricants. Hexagonal boron nitride ("hBN") is a very desirable form and a white composition having hexagonal layer structure similar to graphite. Because of its properties, it has found uses in heat conductivity applications, electrical insulation applications, corrosion resistance applications, lubrication applications, and as a plastic additive. Boron nitride can be molded and used in composite materials or as a raw material for cubic boron nitride. It is used in many applications including electronic materials, non-oxidizing ceramics sintering filler powder, makeup materials, medical additives, etc.

BN may be manufactured in a high temperature reaction between inorganic raw materials into a white powder composition of BN particles, having a hexagonal structure similar to graphite in platelet morphology. When platelet BN is added as a filler to a polymer, a blended material is formed having poor rheological properties. At loaded concentrations above 30 wt. % BN, the blended material is so viscous that it is difficult to dispense from a mechanical dispenser such as a syringe.

U.S. Pat. No. 6,731,088 discloses a dry powder of spherically shaped agglomerates of irregular non-spherical BN particles bound together by a binder and subsequently spray-dried. The spherically shaped BN agglomerates can be compounded into polymer compositions at levels of 35-50 wt. % for compositions with viscosity below about 300 cp. U.S. Pat. No. 6,652,822 discloses crystalline particles of BN by generating aerosol comprising precursor of BN particles, generating plasma, and directing the aerosol into and out of the plasma hot zone, with BN being spherical in shape with a diameter of about 1-1000 microns.

There is a need for improved BN compositions having improved properties. There is also a need for BN compositions that can be used in large quantities as a filler in applications such as electronic materials, thermally conductive compositions, and the like. It is particularly desirable for improved BN compositions to be manufactured from existing BN stock as in the mixed boron nitride blends of the invention.

SUMMARY OF THE INVENTION

The present invention is directed to a boron nitride composition comprising at least two different types of boron nitride powder materials.

The present invention further provides a polymer composition comprising a boron nitride filler containing at least two different types of boron nitride powder materials.

DETAILED DESCRIPTION OF THE INVENTION

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

As used herein, the term "functionalized" may be used interchangeably with "surface functionalized," "functionalized surface," "coated," "surface treated," or "treated," referring to the coating of the boron nitride component in agglomerate form or platelet form a coupling or a coating agent.

As used herein, the term "functionalization" or "functionalized" relates to modification of the BN surface to provide a plurality of functional groups on the BN surface. A "functionalized surface" as used herein refers to the coating that has been modified so that a plurality of functional groups are covalently attached thereto, either directly or indirectly.

As used herein, the phrase "effective amount" or "sufficient amount" means that amount sufficient to bring about the desired effect, e.g., lowering the viscosity of a polymeric composition at least 20% over the viscosity of a polymeric composition not having this effective amount.

Hexagonal boron nitride ("h-BN") is an inert, lubricious ceramic material having a platey hexagonal crystalline structure, which is similar to that of graphite. In one specific embodiment, the invention relates to a mixture (or blend) of at least two different boron nitride powder materials for synergistic effects, i.e., improved properties. The different boron nitride powder materials are selected from platelet boron nitride and non-platelet boron nitride. Non-platelet boron nitride is defined herein as any boron nitride other than platelet boron nitride. For example, non-boron nitride powder materials can include agglomerates of boron nitride that are made up of boron nitride platelets. The agglomerates of boron nitride powder materials can have spherical or irregular shape and vary in size from each other. Other non-platelet boron nitride powder materials include, but are not limited to, for example, partially crystalline boron nitride, amorphous boron nitride, turbostratic boron nitride, and nano boron nitride powder materials having different properties including but not limited to surface areas, sizes, aspect ratios, tap densities. According to an embodiment, the two different boron nitride powder materials can be two different spherical agglomerates of boron nitride powder materials having different particle sizes.

Boron Nitride Powder Components.

In one embodiment, at least one of the two different BN powder materials comprises crystalline or partially crystalline boron nitride particles made by processes known in the art, in either agglomerate boron nitride or platelet boron nitride forms. These include spherical BN particles in the micron size range produced in a process utilizing a plasma gas as disclosed in U.S. Pat. No. 6,652,822; hBN powder comprising spherical boron nitride agglomerates are formed of irregular non-spherical BN particles bound together by a binder and subsequently spray-dried, as disclosed in U.S. Patent Publication No. US2001/0021740; BN powder produced from a pressing process as disclosed in U.S. Pat. Nos. 5,898,009 and 6,048,511; BN agglomerated powder as disclosed in U.S. Patent Publication No. 2005.0041373; BN powder having high thermal diffusivity as disclosed in U.S. Patent Publication No. US20040208812A1; and highly delaminated BN powder as disclosed in U.S. Pat. No. 6,951,583.

According to an embodiment of the invention, the boron nitride composition comprises at least two different types of boron nitride powder materials selected from the groups consisting of platelet boron nitride powder material, agglomerates of boron nitride powder material, partially crystalline boron nitride powder material, amorphous boron nitride powder material, turbostratic boron nitride powder material, and nano boron nitride powder materials.

According to an embodiment of the invention, the boron nitride composition comprises at least two different types of boron nitride powder materials wherein the boron nitride powder materials have particle size distributions distinct from each other.

In one embodiment, at least one of the BN powders has an average particle size of at least 50 microns. In another embodiment, at least one of the BN powder has an average particle size of 5 to 500 microns. In a third embodiment, from 10 to 100 microns.

In one embodiment, at least one of the BN powder comprises irregularly-shaped agglomerates of hexagonal boron nitride (hBN) platelets, having an average particle size of above 10 microns.

In another embodiment, at least one of the BN powder is "spherical," i.e., comprising relatively spherical agglomerates of hBN platelets and the second BN powder is in the form of hBN platelet. The incorporation of spherical BN as one of the components of the blend allows the blend to have characteristics of a typical spherical BN composition, e.g., increased surface areas and excellent thermal conductivity. In one embodiment, the spherical BN powder component comprises agglomerates have an average agglomerate size distribution (ASD) or diameter from 10 to 500 microns. In another embodiment, the spherical BN powder component has an ASD in the range of 30 to 125 microns. In one embodiment, the ASD of the spherical BN powder component is 74 to 100 microns. In another embodiment, 10 to 40 microns.

In one embodiment, one of the BN powders in the blend is in the form of platelets having an average diameter of at least about 1 micron, and typically between about 1 and 20 µm, and a thickness of no more than about 50. In another embodiment, the powder is in the form of platelets having an average aspect ratio of from about 50 to about 300.

In one embodiment, one of the BN powders is a h-BN powder having a highly ordered hexagonal structure with a crystallization index of at least 0.12. In another embodiment, the BN powder has a crystallinity of about 0.20 to about 0.55, and in yet another embodiment, from about 0.30 to about 0.55.

In applications wherein the BN powder is to be used as fillers in polymer composites, e.g., microprocessor packaging requiring high thermal conductivity properties, one of the BN powders in the blend displays an average particle size of about 5 to 25 microns; about 60 to 90 vol. % of the particles display an average particle size of about 40 to 80 microns.

Methods for Preparing Blends:

The BN blends of the invention may be prepared using mixing processes and equipment known in the art. In one embodiment, a mixture comprising at least two different BN powder materials, e.g., a spherical BN and a platelet BN, spherical BN powders of different sizes and/or tap density, platelet BN powders of different sizes and/or surface areas, etc., are mixed together in a V-blender for at least 15 minutes.

In one embodiment and prior to the mixing or blending, the different BN powder materials are dried in a forced air oven for about 300° F. for at least 6 hrs. and then kept at 120° F. before mixing. In another embodiment before mixing, at least one of the different BN powders is sintered at a temperature of at least 1800° C. for about 1 to 4 hrs. Suitable atmospheres for sintering include inert gas, nitrogen, and argon. In one embodiment, the sintering is in a vacuum.

Preparing Polymeric Compound Containing BN Blends:

The BN blends may be used in powder form, or incorporate into a paste form of about 60 to 80 wt. % of solid BN in an aqueous or non-aqueous medium of IPA, methanol, ethanol and the like. In polymeric compounds, the BN in powder or paste form is used in amounts of 30 to 80 wt. % of BN to total weight of the compounds, along with a polymeric matrix component such as a polyester, a melt-processable polymer, a phenolic, a silicone polymer (e.g., a silicone rubber), an acrylic, a wax, a thermoplastic polymer, a low molecular weight fluid, or an epoxy molding compound, for a thermal conductivity of about 1 W/mK to about 25 W/mK.

In one embodiment, the thermoplastic polymer matrix comprises at least one of a liquid crystal polymer; a polyester such as polyethylene naphthalate, polyethylene terephthalate, polybutylene terephthalate; a polyamide; a polyphthalamide; a polyimide; a polyphenylene sulfide; a polycarbonates; a polyetheretherketone; a polyaryletherketone; a polyphenylene oxide; and a mixture thereof.

The polymeric compound containing the BN blends of the invention may be prepared by techniques known in the art, such as melt-mixing in equipment such as a mill, a Banbury, a Brabender, a single or twin screw extruder, continuous mixers, kneaders, etc.

Polymer composites comprising the BN powder blends of the invention may be used for a number of applications, including microprocessor packaging, bearing housings, heat-exchanger applications such as heat sinks for microprocessors and integrated circuit chips, plastic ball grid array packages, quad flat packs, and other common surface-mounted integrated circuit packages, etc., particularly applications demanding a high thermal conductivity which is close to that of pure alumina (about 25 W/m° K).

Examples are provided herein to illustrate the invention but are not intended to limit the scope of the invention. In the Examples, the BN powders used for the blends are commercially available from Momentive Performance Material of Strongsville, Ohio.

Examples 1-5

In the first set of examples, blends of spherical BN powder PTX60 and platelet-shaped BN powder PT110 were made.

The mixtures were blended in a V-blender (4-qrt shell). In each example, the materials were blended for 15 minutes, and tested for thermal conductivity and viscosity. The amount of BN powders used in the examples ranged from 116.2 grams to 1046 grams in each example (depending on the blend ratios in each example).

The BN mixtures were used as fillers in silicone oil as the polymer matrix (Dow 200-100 cst viscosity) at filler concentration ranging from 35 to 55 wt % BN in silicone fluid. The silicone+BN mixture was mixed via a lab scale FlackTek speed mixer at approximately 3500 rpm for 20 seconds. Viscosity was measured twice in silicone oil (Dow 200-100 cst viscosity) using AR-2000 TA Rheometer, and recorded at 1 $s^{-1}$ shear rate.

For thermal conductivity measurements, the BN blends were used in pads made with Sylgard 184 Silicone Resin and curing agent Sylgard 184 as the polymer matrix. The Sylgard fluids were first mixed in speed mixer for 20 seconds at 3500 RPM, then followed by addition of BN fillers, and then mixed for 20 seconds at 3500 RPM. The mixtures was placed in a 3"×5" rectangular mold and pressed at 125° C. for 30 minutes to form pads of 0.5 to 1.5 mm in thickness. Bulk thermal conductivity was measured via a Mathis™ Hot Disk Thermal Constant Analyzer.

Viscosity and thermal conductivity results are reported in Table 1. It should be noted that 40 vol. % BN is equivalent to 60 wt. % BN.

TABLE 1

| Examples | PTX60 | PT110 | Viscosity (poise) at 38 wt % BN, 1s- | TC (W/mK) @ 40 vol % BN |
|---|---|---|---|---|
| Ex. 1 | 100% | 0% | 888 | 12.7 |
| Ex. 2 | 90% | 10% | 338 | 11.3 |
| Ex. 3 | 80% | 20% | 345 | 10.8 |
| Ex. 4 | 50% | 50% | 97 | 10.1 |
| Ex. 5 | 0% | 100% | 100 | 6.9 |

As shown, the viscosity significantly decreases as platelet shaped BN PT110 is added to the spherical BN as shown in Example 2. Also, there is a 90% drop in viscosity of Example 4. Although the thermal conductivity tests employed a different amount of BN (as used in making pads), the thermal conductivity decreased only slightly as the platelet BN loading increased. The results indicate that it is feasible to add a significant amount of (less expensive) platelet-shaped BN to a spherical BN composition for a BN blend to lower the viscosity in polymer compositions while still retaining excellent thermal conductivity.

Examples 6-8

Figure 1:
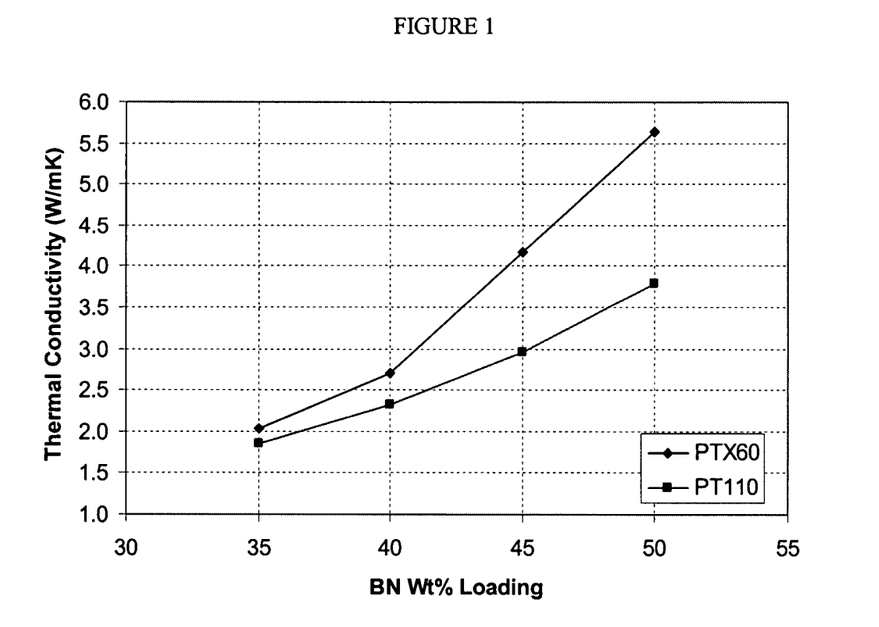
FIG. 1 is a graphical illustration of the viscosity of two different boron nitride powder materials, PTX60 and PT110.
Figure 2:
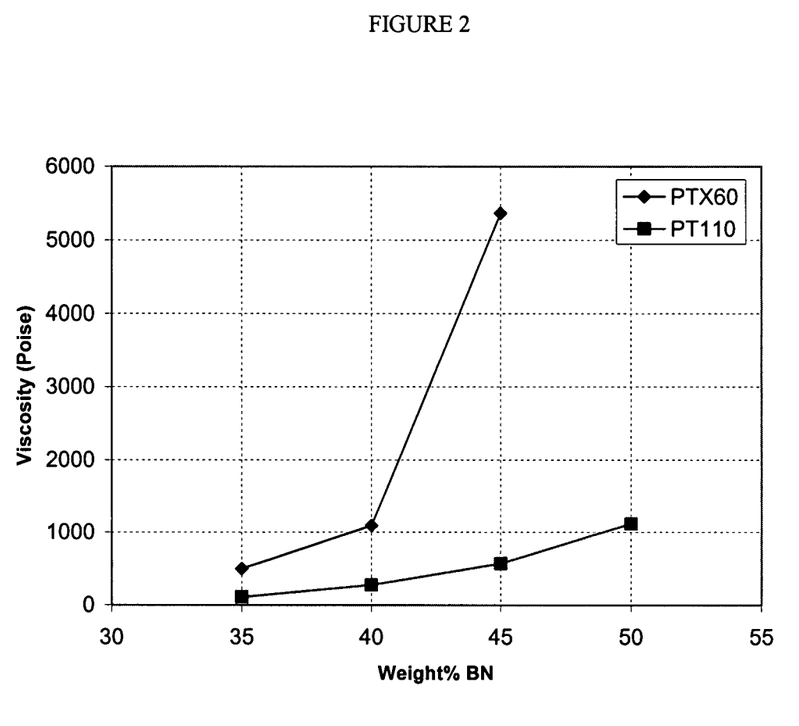
FIG. 2 is a graphical illustration of the thermal conductivity of two different boron nitride powder materials, PTX60 and PT110.
Figure 3:
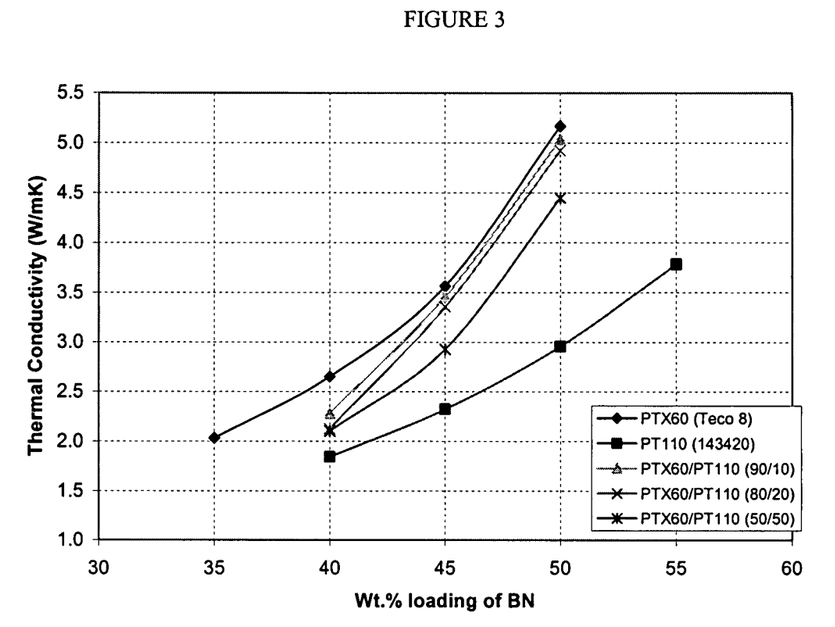
FIG. 3 is a graphical illustration of the thermal conductivity of blends of two boron nitride powder materials PTX60 and PT110 at different ratios and different loadings in polymer compositions.
Figure 4:
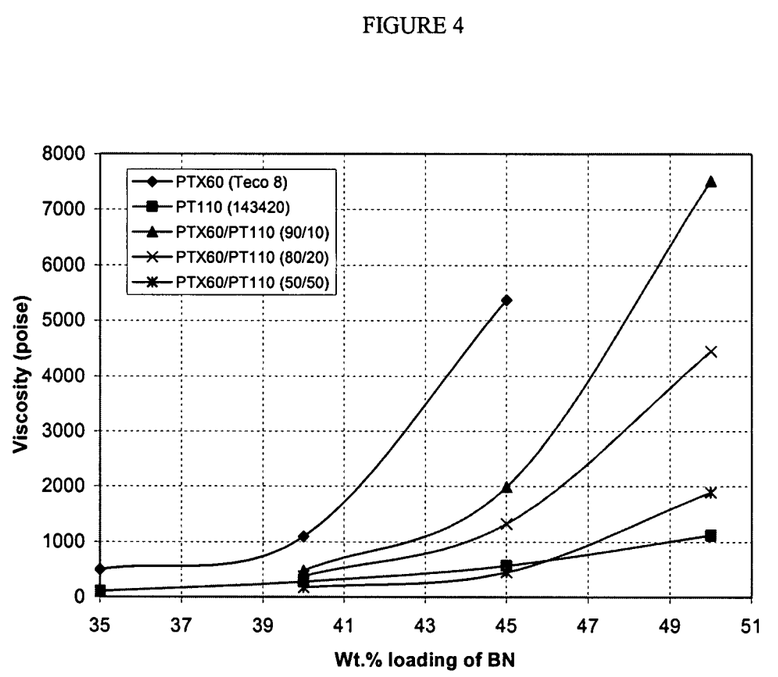
FIG. 4 is a graphical illustration of the viscosity of blends of two boron nitride powder materials PTX60 and PT110 at different ratios and different loadings in polymer compositions.

Platelet-shaped BN PT110 and spherical BN PTX60 were used again to make blends and analyzed at different loadings in the same polymer matrix of Examples Set A. The results are shown in Tables 2-4, and plotted in FIGS. 1 and 2.

TABLE 2

Viscosity at 1 $s^{-1}$ (poise) of spherical BN powder PTX60, platelet BN powder PT110 and blends

| wt % | Example 6 PTX60/PT110 (90/10) | Example 7 PTX60/PT110 (80/20) | Example 8 PTX60/PT110 (50/50) |
|---|---|---|---|
| 35 | — | — | — |
| 40 | 479 | 379 | 171 |
| 45 | 1988 | 1320 | 447 |
| 50 | 7520 | 4450 | 1888 |
| 55 | — | — | — |

TABLE 3

Thermal conductivity (W/mK) of spherical BN powder PTX60, platelet BN powder PT110 and blends

| wt % | Example 6 PTX60/PT110 (90/10) | Example 7 PTX60/PT110 (80/20) | Example 8 PTX60/PT110 (50/50) |
|---|---|---|---|
| 35 | — | — | — |
| 40 | 2.3 | 2.1 | 2.1 |
| 45 | 3.5 | 3.4 | 2.9 |
| 50 | 5 | 4.9 | 4.4 |
| 55 | — | — | — |

As shown in Table 2, it can be extrapolated that the thermal conductivity of 50/50 blend at 1100 poise viscosity (~48 wt %) will be approximately 3.7 W/mK. This results in a 43% higher thermal conductivity than using the spherical BN powder PTX60 at 40 wt %, which has a viscosity of 1100 poise and thermal conductivity of 2.6 W/mK.

Table 4 shows the properties of the platelet BN powder PT110, spherical BN powder PTX60 and blends made thereof. The original particle sizes of PTX60 and PT110 (D50) are similar, but after a 50/50 blending they are lowered to 45 microns (see Example 4). These blends show good thermal conductivity, in fact at a constant viscosity, the thermal conductivity improved by 20% when using a blend (50/50—Example 4) versus PTX60 (Example 1).

TABLE 4

Properties of PTX60, PT110, and blends of the 2 BN grades.

| Properties | PTX60 | PT110 | PTX60/ PT110 (90/10) | PTX60/ PT110 (80/20) | PTX60/ PT110 (50/50) |
|---|---|---|---|---|---|
| D10 (microns) | 17.1 | 23.2 | 10.6 | 11.5 | 13.8 |
| D50 (microns) | 55.8 | 52.2 | 39.8 | 43.1 | 44.8 |
| D90 (microns) | 87.2 | 83.6 | 77.6 | 82 | 85.6 |
| Oxygen % | 0.1 | 0.149 | — | — | — |
| Surface Area (m2/g) | 5.9 | 0.7 | — | — | — |
| Tap Density (g/ml) | 0.42 | 0.71 | — | — | — |
| Soluble Borates % | 0.03 | 0.03 | — | — | — |
| Carbon % | 0.02 | 0.052 | — | — | — |

Examples 9-18

In these examples, platelet BN grades such as NX1, PT120, and PT110 were used separate or together to study effect of particle size distribution on thermal conductivity and viscosity performances. The powders were blended in a lab scale FlackTek speed mixer at approximately 3500 rpm for 20 seconds. Viscosity was measured twice in silicone oil (Dow 200-100 cst viscosity) using AR-2000 TA Rheometer. The viscosity reported was recorded at 1/s shear rate.

The fillers or mixture of fillers were added to the silicone and mixed via a lab scale FlackTek speed mixer at approximately 3500 rpm for 20 seconds. The filler concentration was 38 wt % in silicone fluid. The pads were made with Sylgard 184 Silicone Resin and curing agent Sylgard 184. The sylgard fluids are mixed in speed mixer for 20 seconds at 3500 RPM followed by addition of fillers using again speed mixer for 20 seconds at 3500 RPM. The filler concentration was 40 vol. % (59 wt %) in silicone. The mixture is placed in a 3"×5" rectangular mold and pressed at 125° C. for 30 minutes to form pads of 0.5 to 1.5 mm in thickness. The bulk thermal conductivity is measured via a Mathis™ Hot Disk Thermal Constant Analyzer.

The properties of the different grades of boron nitride used are shown in Table 5. One key observation is that in this experiment only platelet BN was used with different particle sizes (D50): ranging from 0.7 to 41 microns. Table 6 presents the performance (viscosity and thermal conductivity (TC)) data of 10 different examples (Example 9 though 18) with these grades. For instance, similar TC and viscosity can be obtained with simply PT110 (Example 12) or with a combination of PT120 and PT110 (Example 16); in this case the particle size distribution for the former has a D50 of 41 and 26 for the later (Table 7).

TABLE 5

Properties of different platelet BN grades used in experiment

| Properties | NX1 | PT120 | PT110 |
|---|---|---|---|
| D10 (microns) | 0.3 | 5.9 | 18.2 |
| D50 (microns) | 0.7 | 9.8 | 41.3 |
| D90 (microns) | 3.6 | 15.4 | 76.6 |
| Oxygen % | 1.02 | 0.17 | 0.29 |
| Surface Area (m2/g) | 22 | 4.2 | 1.2 |
| Tap Density (g/ml) | 0.11 | 0.41 | 0.77 |
| Soluble Borates % | 0.01 | 0.09 | 0.04 |
| Carbon % | 0.02 | | 0.03 |

TABLE 6

Viscosity and Thermal Conductivity of 10 different examples with platelet BN.

| Example | Ratio NX1 | Ratio PT120 | Ratio PT110 | Viscosity (poise) at 38 wt % BN, 1s- | TC (W/mK) at 40 vol % BN |
|---|---|---|---|---|---|
| Ex. 9 | 100% | 0% | 0% | 13045 | 2.3 |
| Ex. 10 | 17% | 17% | 67% | 374 | 5 |
| Ex. 11 | 0% | 100% | 0% | 566 | 6.2 |
| Ex. 12 | 0% | 0% | 100% | 122 | 5.5 |
| Ex. 13 | 17% | 67% | 17% | 937 | 5.1 |
| Ex. 14 | 50% | 0% | 50% | 2309 | 3.9 |
| Ex. 15 | 50% | 50% | 0% | 1928 | 4 |
| Ex. 16 | 0% | 50% | 50% | 119 | 5.4 |
| Ex. 17 | 67% | 17% | 17% | 4354 | 3.3 |
| Ex. 18 | 33% | 33% | 33% | 1470 | 4.1 |

TABLE 7

Particle size distribution of 10 different examples with platelet BN.

| Examples | NX1 | PT120 | PT110 | D10 | D50 | D90 |
|---|---|---|---|---|---|---|
| Ex. 9 | 100% | 0% | 0% | 0.3 | 0.7 | 3.6 |
| Ex. 10 | 17% | 17% | 67% | 13.2 | 29.3 | 54.2 |
| Ex. 11 | 0% | 100% | 0% | 5.9 | 9.8 | 15.4 |
| Ex. 12 | 0% | 0% | 100% | 18.2 | 41.3 | 76.6 |
| Ex. 13 | 17% | 67% | 17% | 7 | 13.5 | 23.6 |
| Ex. 14 | 50% | 0% | 50% | 9.2 | 21 | 40.1 |
| Ex. 15 | 50% | 50% | 0% | 3.1 | 5.2 | 9.5 |
| Ex. 16 | 0% | 50% | 50% | 12.1 | 25.6 | 46 |
| Ex. 17 | 67% | 17% | 17% | 4.2 | 9 | 17.7 |
| Ex. 18 | 33% | 33% | 33% | 8.1 | 17.3 | 31.9 |

Examples 19-28

The Examples were conducted to study the effect of spending spherical BN powders. In the examples, spherical BN grades such as PTX25, PTX60, and large PTX were used separate or together to study effect of particle size distribution on thermal conductivity and viscosity performances. The powders were blended in a lab scale FlackTek speed mixer at approximately 3500 rpm for 20 seconds. Viscosity was measured twice in silicone oil (Dow 200-100 cst viscosity) using AR-2000 TA Rheometer. The viscosity reported was recorded at 1/s shear rate.

The fillers or mixture of fillers were added to the silicone and mixed via a lab scale FlackTek speed mixer at approximately 3500 rpm for 20 seconds. The filler concentration was 38 wt % in silicone fluid. The pads were made with Sylgard 184 Silicone Resin and curing agent Sylgard 184. The sylgard fluids are mixed in speed mixer for 20 seconds at 3500 RPM followed by addition of fillers using again speed mixer for 20 seconds at 3500 RPM. The filler concentration was 40 vol. % (59 wt %) in silicone. The mixture is placed in a 3"×5" rectangular mold and pressed at 125° C. for 30 minutes to form pads of 0.5 to 1.5 mm in thickness. The bulk thermal conductivity is measured via a Mathis™ Hot Disk Thermal Constant Analyzer. The through plane conductivity was measured via laser flash, Netzsch LFA447.

The properties of the different grades of boron nitride used are shown in Table 8. One key observation is that in this experiment only spherical BN was used with different particle sizes (D50): ranging from 18 to 200 microns. Table 9 presents the performance (viscosity and thermal conductivity) data of 10 different examples (Example is 16 though 25) with these grades.

For instance, similar TC and viscosity can be obtained with simply Large PTX (Example 22) or with a combination of PTX25 (17%), PTX60 (17%) and Large PTX (66%) (Example 20); in this case the particle size distribution for the former has a D50 of 180 and 26 for the later (Table 10). Another example of comparable performance with different particle size distribution includes Examples 21, 23 and 24. PTX60 performance is comparable with a mixture of 50% PTX25 and 50% Large PTX, or 66% PTX60, 17% PTX25 and 17% Large PTX. Also the mixture containing all 3 different size spheres at ⅓ concentration each (Example 28), results in similar properties to Examples 21, 23 and 24.

TABLE 8

Properties of different spherical BN grades used in experiment

| Properties | PTX25 | PTX60 | Large PTX |
|---|---|---|---|
| D10 (microns) | 7.6 | 17.1 | 90 |
| D50 (microns) | 19.8 | 55.8 | 180 |
| D90 (microns) | 36.2 | 87.2 | 250 |
| Oxygen % | 0.25 | 0.1 | 0.08 |
| Surface Area (m2/g) | 6.9 | 5.9 | 6.8 |

TABLE 8-continued

Properties of different spherical BN grades used in experiment

| Properties | PTX25 | PTX60 | Large PTX |
|---|---|---|---|
| Tap Density (g/ml) | 0.35 | 0.42 | 0.48 |
| Soluble Borates % | 0.05 | 0.03 | 0.04 |
| Carbon % | 0.03 | 0.02 | 0.04 |

TABLE 9

Viscosity and Thermal Conductivity of 10 different examples with spherical BN

| Example | Ratio PTX25 | Ratio PTX60 | Ratio Large PTX | Viscosity (poise) at 38 wt % BN, 1s- | Bulk TC (W/mK) at 40 vol % BN | Through-plane TC (W/mK) at 40 vol % BN |
|---|---|---|---|---|---|---|
| Ex. 19 | 100% | 0% | 0% | 4999 | 11.6 | 2.7 |
| Ex. 20 | 17% | 17% | 67% | 405 | 12.5 | 9.1 |
| Ex. 21 | 0% | 100% | 0% | 888 | 12.7 | 6 |
| Ex. 22 | 0% | 0% | 100% | 396 | 12.5 | 9.4 |
| Ex. 23 | 17% | 67% | 17% | 846 | 12.4 | 6.5 |
| Ex. 24 | 50% | 0% | 50% | 838 | 10.9 | 5.7 |
| Ex. 25 | 50% | 50% | 0% | 2012 | 11.5 | 4.4 |
| Ex. 26 | 0% | 50% | 50% | 548 | 12.3 | 9.1 |
| Ex. 27 | 67% | 17% | 17% | 2082 | 10.1 | 3.7 |
| Ex. 28 | 33% | 33% | 33% | 855 | 10.6 | 6 |

TABLE 10

Particle size distribution of 10 different examples with spherical BN

| Examples | Ratio PTX25 | Ratio PTX60 | Ratio Large PTX | D10 | D50 | D90 |
|---|---|---|---|---|---|---|
| Ex. 19 | 100% | 0% | 0% | 8 | 20 | 36 |
| Ex. 20 | 17% | 17% | 67% | 64 | 133 | 187 |
| Ex. 21 | 0% | 100% | 0% | 17 | 56 | 87 |
| Ex. 22 | 0% | 0% | 100% | 90 | 180 | 250 |
| Ex. 23 | 17% | 67% | 17% | 28 | 70 | 106 |
| Ex. 24 | 50% | 0% | 50% | 49 | 100 | 143 |
| Ex. 25 | 50% | 50% | 0% | 12 | 38 | 62 |
| Ex. 26 | 0% | 50% | 50% | 54 | 118 | 169 |
| Ex. 27 | 67% | 17% | 17% | 23 | 52 | 80 |
| Ex. 28 | 33% | 33% | 33% | 38 | 85 | 124 |

The data presented in the examples above clearly demonstrate the advantages of blending different forms of boron nitride powders such as platelets and agglomerates (PT110 and PTX60) or spherical agglomerates of various sizes (PTX25, PTX60 and Large PTX) to achieve good thermal conductivity at reduced viscosities. While these examples demonstrate this concept with the use of spherical boron nitride agglomerates, similar benefits will also be realized using irregular shaped boron nitride agglomerates like those that are known previously in the art, see for example U.S. Pat. No. 5,898,009 to Shaffer.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

All citations referred herein are expressly incorporated herein by reference.

The invention claimed is:

1. A boron nitride composition comprising at least two different types of boron nitride powder materials, wherein the boron nitride powder materials are platelet boron nitride powder material and spherical agglomerates of boron nitride powder material, the spherical agglomerates being untreated.

2. The boron nitride composition of claim 1, further comprising a boron nitride powder material selected from the group consisting of agglomerates of boron nitride powder material, partially crystalline boron nitride powder material, amorphous boron nitride powder material, turbostratic boron nitride powder material and nano boron nitride powder materials.

3. The boron nitride composition of claim 1, wherein the spherical agglomerates of boron nitride comprises agglomerates having different sizes.

4. The boron nitride composition of claim 1, wherein the boron nitride powder materials have particle size distributions distinct from each other.

5. The boron nitride composition of claim 1, wherein at least one of the boron nitride powder materials has an average particle size of at least 5 microns.

6. The boron nitride composition of claim 1, wherein the platelets have an average diameter of at least about 1 micron.

7. The boron nitride composition of claim 1, wherein the agglomerates have an average particle size of 5 to 500 microns.

8. A polymer composition comprising a boron nitride filler containing at least two different types of boron nitride powder materials wherein the boron nitride powder materials are platelet boron nitride powder material and spherical agglomerates of boron nitride powder material, the spherical agglomerates being untreated.

9. The polymer composition of claim 8, wherein the polymer is at least one selected from the group consisting of polyester, melt-processable polymer, phenolic polymer, silicone polymer, acrylic polymer, wax, thermoplastic polymer, liquid crystal polymer and epoxy polymer.

10. The polymer composition of claim 8, wherein the polymer is at least one selected from the group consisting of polyethylene naphthalate, polyethylene terephthalate, polybutylene terephthalate, polyphthalamide, polyimide, polyamide, polyphenylene sulfide, polycarbonate, polyetheretherketone, polyaryletherketone and polyphenylene oxide.

11. The polymer composition of claim 8, further comprising different types of boron nitride powder materials selected from the groups consisting of agglomerates of boron nitride powder material, partially crystalline boron nitride powder material, amorphous boron nitride powder material, turbostratic boron nitride powder material and nano boron nitride powder materials.

12. The polymer composition of claim 8, wherein the boron nitride powder materials have particle size distributions distinct from each other.

13. The polymer composition of claim 8, wherein at least one of the boron nitride powder materials has an average particle size of at least 5 microns.

14. The polymer composition of claim 8, wherein the platelets have an average diameter of at least about 1 micron.

15. The polymer composition of claim 8, wherein the agglomerates have an average particle size of 5 to 500 microns.

16. The polymer composition of claim 8, wherein the spherical agglomerates of boron nitride comprise agglomerates having different sizes.

* * * * *